(12) United States Patent
Reddy

(10) Patent No.: US 6,403,448 B1
(45) Date of Patent: *Jun. 11, 2002

(54) SEMICONDUCTOR DEVICES HAVING COOPERATIVE MODE OPTION AT ASSEMBLY STAGE AND METHOD THEREOF

(75) Inventor: Chitranjan N. Reddy, Los Altos Hills, CA (US)

(73) Assignee: Alliance Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,087

(22) Filed: Dec. 30, 1997

Related U.S. Application Data

(62) Division of application No. 08/681,206, filed on Jul. 22, 1996, now Pat. No. 5,767,565.

(51) Int. Cl.[7] .............................................. H01L 1/301
(52) U.S. Cl. ........................ 438/460; 438/113; 438/130; 438/462
(58) Field of Search ................................ 438/460, 462, 438/113, 130, 6, 14, 15

(56) References Cited

U.S. PATENT DOCUMENTS

| | | | | |
|---|---|---|---|---|
| 4,446,475 A | * | 5/1984 | Gercekci et al. ............ | 438/460 |
| 4,978,633 A | * | 12/1990 | Seefeldt et al. ............. | 438/460 |
| 5,015,600 A | * | 5/1991 | Livermore et al. ......... | 257/370 |
| 5,161,124 A | * | 11/1992 | Love ........................... | 365/51 |
| 5,217,916 A | * | 6/1993 | Anderson et al. ........... | 438/462 |
| 5,650,348 A | * | 7/1997 | Pasch .......................... | 438/599 |
| 5,679,609 A | * | 10/1997 | Aimi et al. .................... | 438/15 |
| 5,721,151 A | * | 2/1998 | Padmanabhan et al. ..... | 438/598 |
| 5,786,719 A | * | 7/1998 | Furutani ....................... | 327/18 |
| 5,853,603 A | * | 12/1998 | Caillat .......................... | 438/14 |
| 6,078,096 A | * | 6/2000 | Kimura et al. .............. | 257/620 |

\* cited by examiner

Primary Examiner—Carl Whitehead, Jr.
Assistant Examiner—Jeff Vockrodt
(74) Attorney, Agent, or Firm—Stallman & Pollock LLP

(57) ABSTRACT

A method of manufacturing integrated circuits having single and multiple device modes is described. In a preferred random access memory (RAM) embodiment, a first static RAM (SRAM) 10a having a "by n" input/output (I/O) configuration is fabricated adjacent to a second SRAM 10b having the same I/O configuration. An interconnect scheme 14 spans a single device scribe line 18 that separates SRAM 10a from SRAM 10b, and carries address, timing, and control signals between the adjacent SRAMs (10a and 10b). In the event single SRAMs of a "×n" configuration are desired, the wafer is sawed along the single device scribe line 18 severing the interconnect scheme 14. In the event multiple device SRAMs of a "×2n" configuration are desired, the wafer is sawed into multiple device dies, and the interconnect scheme kept intact.

5 Claims, 10 Drawing Sheets

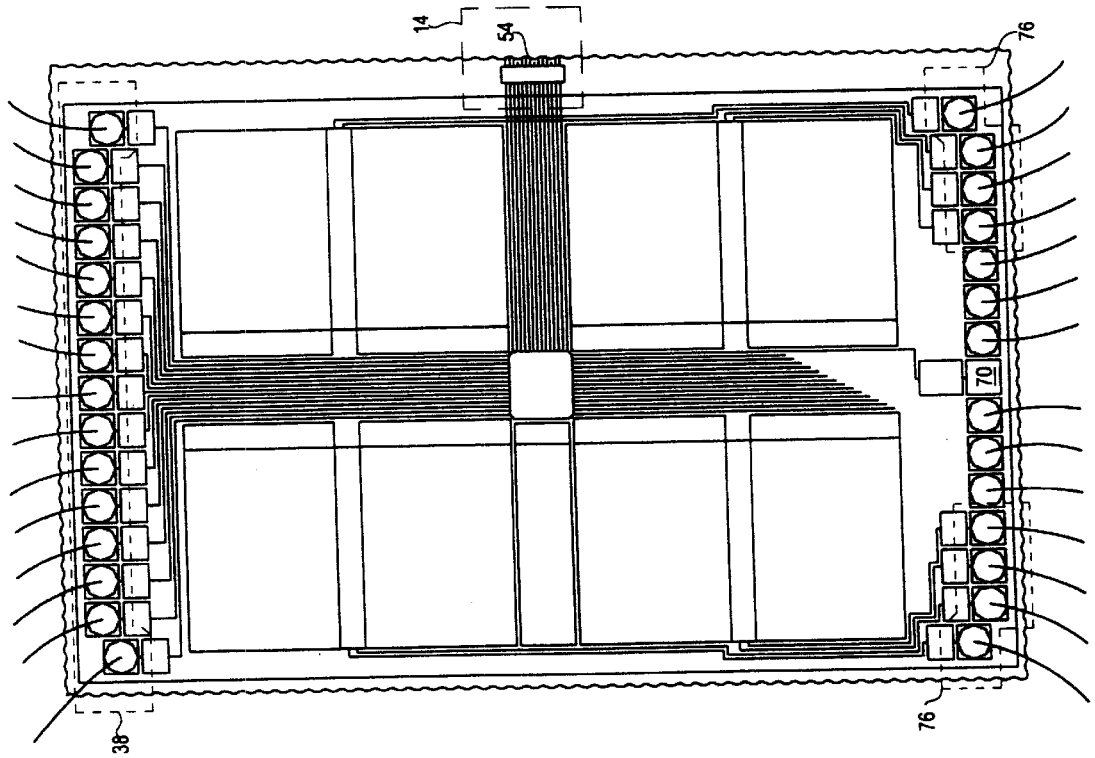

SEMICONDUCTOR DEVICES HAVING COOPERATIVE MODE OPTION AT ASSEMBLY STAGE AND METHOD THEREOF

This application is a divisional of application Ser. No. 08/681,206, filed Jul. 22, 1996, which is now U.S. Pat. No. 5,767,565.

TECHNICAL FIELD

The present invention relates generally to the semiconductor integrated circuits and more particularly to an apparatus and method that provides for single and multiple device dicing options for random access memories (RAMs).

BACKGROUND OF THE INVENTION

The manufacture of integrated circuits (ICs) typically begins with the formation of active devices in a semiconductor wafer substrate, followed by the interconnection of the active devices with one or more patterned conductive (wiring) layers. The ICs are usually separated by from one another on the surface of the wafer by perpendicular lanes (called "streets," "saw lanes" or "scribe lines"). The scribe lines indicate where the wafer will be cut to produce individual ICs.

It is known in the prior art to provide test circuits or other expendable structures in the scribe lines that come into contact with the ICs themselves. For example, U.S. Pat. No. 5,059,899 issued to Farnsworth et al. on Oct. 22, 1991 discloses test bond pads and/or circuitry, disposed within the scribe lines of a wafer, that are coupled to ICs by interconnecting lines. When the wafer is cut, the interconnecting lines are severed.

Prior to cutting the wafer, each IC is tested for some level of functionality. Failing ICs are typically identified by an ink mark. The wafer is then cut (usually with a saw) along the scribe lines to produce rectangular sections containing one IC (called slices or dies). In order to eliminate lifting of layers during the sawing the process, and to ensure that contaminants do not subsequently migrate into the active areas of the IC, guard rings or guard walls run along the periphery of each IC. U.S. Pat. No. 5,270,256 issued to Bost et al. on Dec. 14, 1993 discloses a method of forming a guard wall around the edge of an integrated circuit to prevent delamination effects. Functional dies are placed into circuit packages and electrically connected to package leads by bond wires connected at one end to bond pads on the IC and at the other end to the package leads.

It is also desirable to provide ICs that can be adjusted between two or more operational modes. Such multi-mode ICs can be manufactured en masse, and subsequently configured according to current demands. Unfortunately, once the last wiring layers have been patterned on the wafer, the IC is essentially complete and little variation can be introduced into the IC's functionality without resorting to complex manufacturing processes and/or additional circuitry.

It is known in the prior art to provide memory devices having adjustable data input/output (I/O) widths. A mode circuit is provided that is responsive to a number of control signals. In response to a particular signal or sequence of signals, the type of I/O configuration may be altered. For example, a 16 Megabit (Mb) DRAM can have a default configuration of a sixteen bit I/O (1M×16) and be subsequently programmed to an eight bit I/O (2M×8). The drawback of such approaches is the additional circuit complexity and die area that are required to implement such programmable mode options.

It is also known in the prior art to use the initial portion of the fabrication process to create a number of circuits having standard functions, and then to wire the standard circuits with one or more custom wiring layers to produce an IC having a custom function. The standard circuits can vary from very complex circuits, selected from a standard library of circuit blocks, to more basic circuits, such as individual logic gates. In order to minimize wasted die area in such custom or semi-custom approaches, it is known to dispense with scribe lines, and to cut through active device areas.

U.S. Pat. No. 5,016,080 issued to Piccolo T. Giannella on May 14, 1991 discloses a method of fabricating semi-custom circuits in which a number of isolated circuit cells are formed on a wafer with scribe lines being provided in only one direction. Groups of adjacent cells are joined by a custom metallization layer to form semi-custom integrated circuits. The wafer is cut along the pre-formed scribe line in one direction and in the second direction according to the semi-custom IC boundaries. The isolation of each circuit cell ensures contamination does not adversely effect the semi-custom ICs.

U.S. Pat. No. 5,217,916 issued to Anderson et al. on Jun. 8, 1993 discloses a method of fabricating application specific integrated circuits in which a wafer is sliced in one direction along saw lanes, and in another (perpendicular) direction, along a rows of transistors.

SUMMARY OF THE INVENTION

It is an object of the present invention to provide a semiconductor device having a stand-alone mode, wherein the integrated circuit provides an output in response to a set of inputs, and a multi-device mode, wherein one or more integrated circuits receive a set of inputs and provide a number of outputs.

It is another object of the present invention to provide a method of manufacturing semiconductor devices having single device and multi-device modes of operation, wherein the mode of operation is determined at the assembly stage.

It is yet another object of the present invention to provide a semiconductor RAM device having a data I/O width that is configurable after devices have been manufactured on a semiconductor wafer.

According to the present invention, a number of integrated circuits are fabricated on a semiconductor wafer. Adjacent integrated circuits are coupled by an interconnect scheme that allows signals received from one integrated circuit to be used by one or more adjacent integrated circuits. If single integrated circuit devices are desired, the wafer is diced into single integrated circuits, and the integrated circuits are placed in a single device mode. If a devices composed of multiple integrated circuits are desired, the wafer is diced into groups of multiple integrated circuits, and the integrated circuits placed in a multiple device mode.

According to one aspect of the present invention, the devices are placed in the single device mode by dicing the wafer into single integrated circuits and cutting through the interconnect schemes.

According to another aspect of the present invention the interconnect scheme connecting adjacent integrated circuits includes an underpass or overpass structure to prevent lifting of the integrated circuit layers during the wafer cutting step of the assembly process.

According to another aspect of the present invention the integrated circuits are RAM devices and the interconnect scheme couples a portion of input addresses from one RAM device to an adjacent RAM device.

According to another aspect of the invention the data I/O width of RAM devices may be increased by adjacent RAM devices providing data I/Os in response to the same address.

An advantage of the present invention is that semiconductor RAM devices may be manufactured as uniform devices on a wafer, and then subsequently diced into multiple device integrated circuits to produce larger I/O width devices.

Other objects and advantages of the present invention will become apparent in light of the following description thereof.

BRIEF DESCRIPTION OF THE DRAWINGS

FIGS. 9a–9b are top plan views illustrating the bonding arrangement of the preferred RAM embodiment in the single device mode and multiple device mode, including a depiction of the effective input signal paths.

DETAILED DESCRIPTION OF THE EMBODIMENTS

Figure 1B:
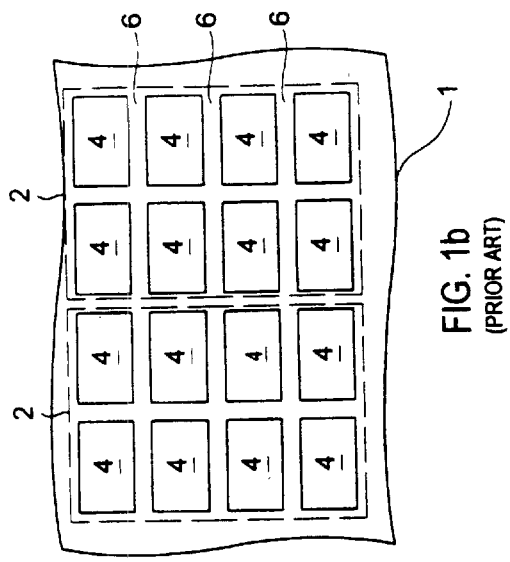
FIGS. 1a–1c are a series of top plan view block diagrams illustrating the fabrication of integrated circuits according to the prior art.
Figure 1C:
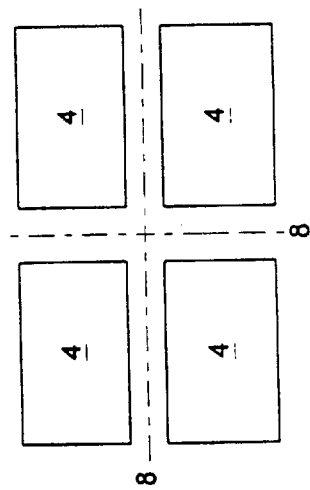
Figure 1A:
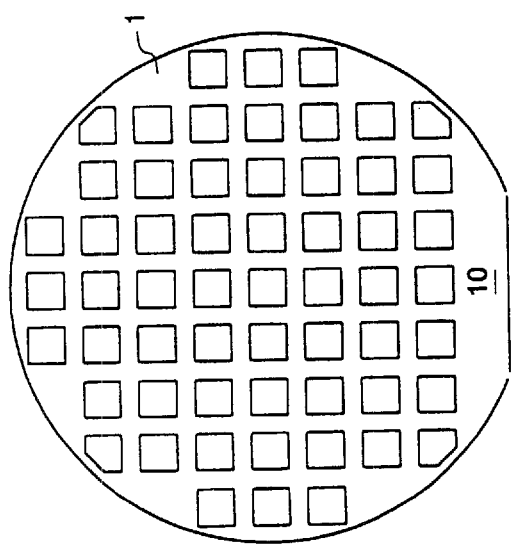

FIGS. 1a–1c set forth a semiconductor device manufacturing approach according to the prior art. FIG. 1a illustrates a semiconductor wafer 1 in which a number of semiconductor devices have been fabricated. The semiconductor devices are typically fabricated in fields, each having a number of identical devices. As set forth in the particular embodiment of FIG. 1b, the semiconductor wafer 1 includes fields 2 each having eight devices 4. The devices 4 are isolated from one another by scribe lines 6. FIG. 1c illustrates four adjacent devices 4 (half of one field 2). During the assembly stage of the manufacturing process, the wafer 1 is cut along the scribe line areas 6 to produce individual devices (dies). The cutting path is illustrated by dashed lines 8 in FIG. 1c. Each die is subsequently placed into an integrated circuit package.

Figure 2A:
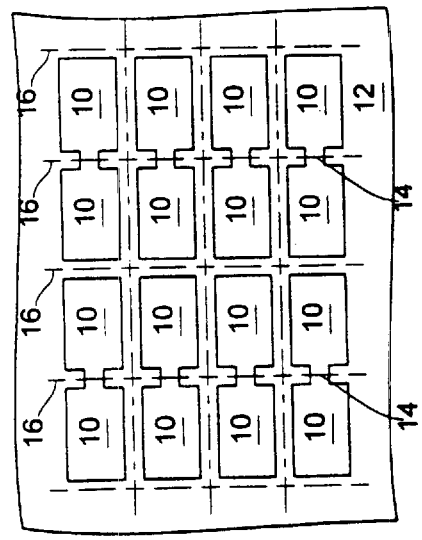
FIGS. 2a–2c are top plan views illustrating the dicing options according to the present invention.
Figure 2B:
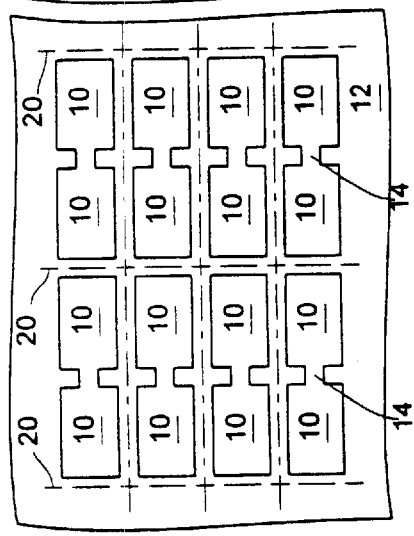
Figure 2C:
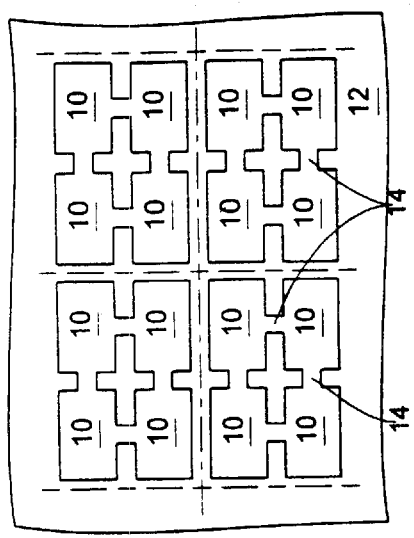

FIGS. 2a–2c illustrate the fabrication of integrated circuit devices according to the present invention. Like the prior art, a number of devices 10 are fabricated in a semiconductor wafer 12. Unlike the prior art, each device 10 has at least two modes of operation: a single device mode and a multiple device mode. Further, each device 10 is coupled to at least one adjacent device 10 by a interconnection scheme 14 that enables signals from one device 10 to be transmitted to the adjacent device, and vice versa. Depending upon the desired mode of operation (i.e., single device or multiple device) the wafer 12 is cut into sections (dies), each containing either single or multiple devices. In the particular embodiment set forth in FIGS. 2a and 2b, each device 10 can operate in a single device mode or a double device mode. The interconnect scheme 14 includes a collection of interconnect lines extending between two adjacent devices 10. FIG. 2a illustrates the dicing option to produce single device dies. As in the case of the prior art, individual dies, each containing one device 10 are produced by cutting along single device scribe lines 16. During the cutting process, the interconnection scheme 14, which spans the single device scribe line area 16, is physically severed. FIG. 2b illustrates the dicing option to produce double devices according to one particular embodiment. Double device dies 18 are produced by cutting the wafer 12 along double device scribe lines 20 so that each resulting die includes two devices 10 connected by the interconnect scheme 14. FIG. 2c is included to illustrate a quadruple device option that naturally follows from the above description of the double device option.

Figure 3:
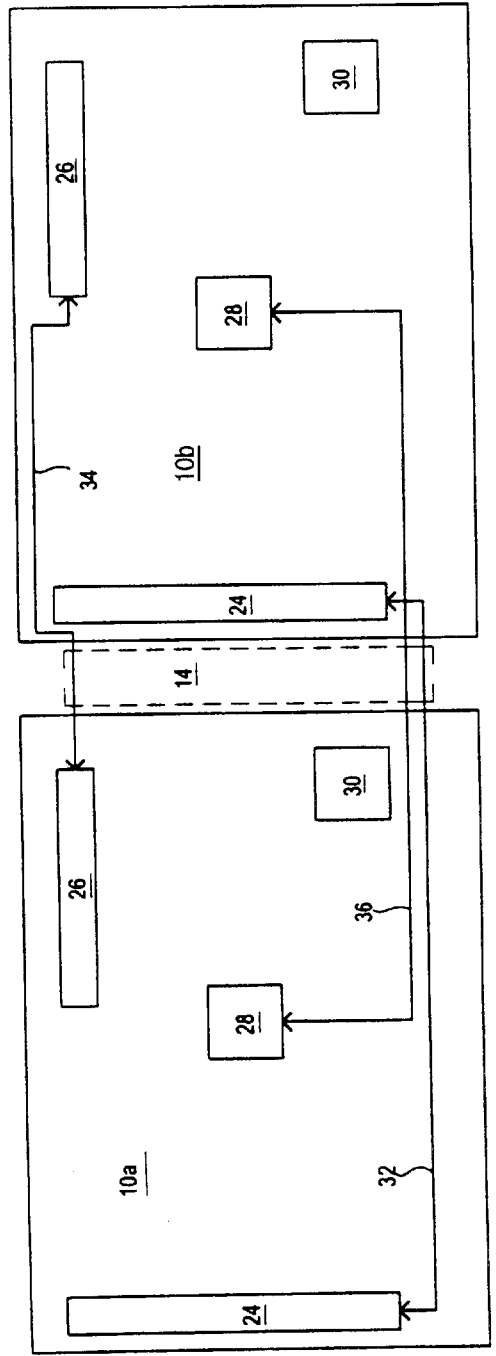
FIG. 3 is a block schematic diagram of the present invention.

FIG. 3 sets forth, generally, two devices (10a and 10b) having a single device mode and a double device mode according to the present invention. Each device (10a and 10b) includes input circuits 24, output circuits 26, a control circuit 28, and a mode circuit 30. The input circuits 24 are conventional in that they are designed to receive externally applied input signals, and translate them into internal input signals for use by the device (10a and 10b). Unlike conventional integrated circuits, the input circuits 24 of the adjacent devices (10b or 10a) are coupled together by inter-device input lines 32 which couple the internal input signals of one of the devices (10a or 10b) to the input circuits 24 of the other (10b or 10a). Like the input circuits 24, the output circuits 26 of each device are conventional in that they drive output pads in response to output signals. In addition, inter-device output lines 34 enable signals from one device to drive the outputs of the other. The operation of each circuit (10b or 10a) is determined by the control circuit 28 of each device (10a and 10b) which are connected by inter-device control lines 36. The portions of the inter-device lines (32, 34 and 36) that physically span the area separating the two devices (10b and 10a) form the interconnect scheme 14. The mode circuit 30 determines if the device will function in the single device mode, in which signals on the inter-device lines (32, 34 and 36) will have no effect on the operation of the device, or in the multiple device mode, in which signals originating in one device are carried by one or more of the inter-device lines for use by an adjacent device.

Figure 4:
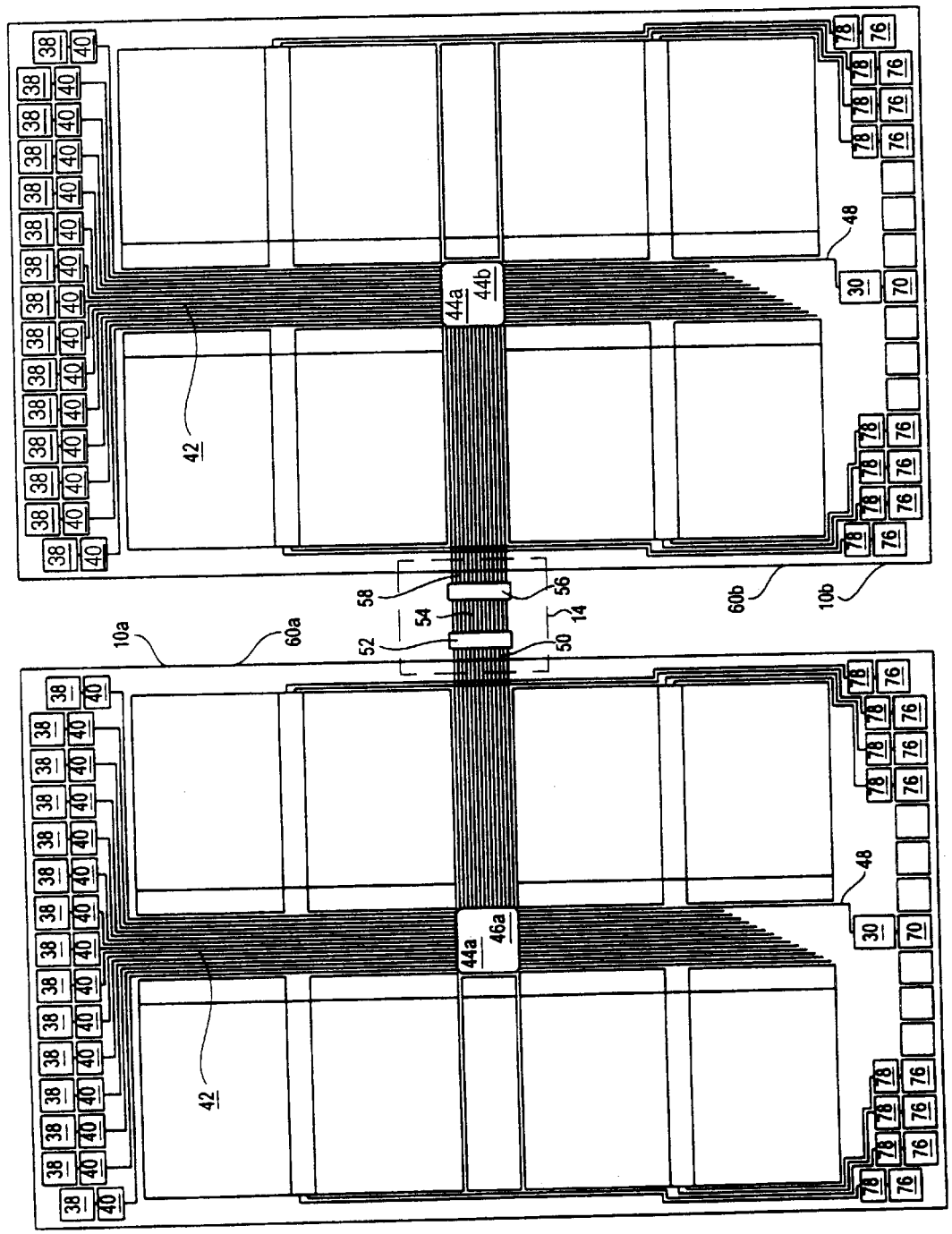
FIG. 4 is a top plan view illustrating the preferred RAM embodiment of the present invention.

Referring now to FIG. 4, a top plan view is set forth illustrating a preferred embodiment of the present invention in which the devices (10a and 10b) are static random access memories (SRAMs). A first SRAM 10a and a second SRAM 10b are fabricated on the same substrate, adjacent to one another. According to the preferred embodiment, the SRAMs (10a and 10b) have a single device mode in which case each SRAM (10a and 10b) is configured as a "by eight" (×8) RAM (i.e., providing a data read or write of eight bits for a given address) and a double device mode in which case the SRAMs (10a and 10b) operate together to provide a ×16 RAM. It is understood that the illustration is not to scale, element thereof being increased or decreased in size in order to more clearly describe the preferred RAM embodiment.

Each SRAM (10a and 10b) has a number of address pads 38 situated at one end of the device. Coupled to each address pad 38 is a corresponding address buffer circuit 40. When the SRAM (10a or 10b) is in operation, the address buffer circuits 40 drive internal address lines 42 in response to external address signals received by their associated address pad 38. The internal address lines 42 carry internal address signals to decoder circuits (44a and 44b) and timing and control circuits (46a and 46b). The decoder circuits (44a and 44b) and timing and control circuits (46a and 46b) operate in either a single device mode or a double device mode, depending upon a mode signal carried on a mode input line 48. In the single device mode, both the decoder circuits (44a and 44b) and the timing and control circuit (46a and 46b) are conventional in operation. The decoder circuits (44a and 44b) generate decode signals which ultimately access a number of cells (eight in the preferred embodiment) in the device. Similarly, the timing and control circuits (46a and 46b) are conventional in operation, generating timing and control signals based upon address transitions. The timing and control signals couple data to or from selected memory cells along an input/output (I/O) path (not shown). In the double device mode, the operation of the SRAMs (10a and 10b) diverges from prior art SRAM circuits. The decoder circuits (44a and 44b) within each SRAM (10a or 10b) select eight memory cells based upon selected internal address signals from its own address buffer circuits 40 in conjunction with external address signals from its adjacent SRAM (10b or 10a). Similarly, the timing and control circuits (46a and 46b) of adjacent SRAMs (10a and 10b) operate in conjunction with one another to ensure that data are accessed simultaneously in both SRAMs (10a and 10b).

Internal address signals are coupled between the two adjacent SRAMs (10a and 10b) by way of interconnect scheme 14. In the preferred embodiment, the interconnect scheme 14 includes first device interconnect members 50, a first under/overpass structure 52, scribe line interconnect members 54, a second under/overpass structure 56, and second device interconnect members 58. The first device interconnect members 50 span a first seal ring 60a that surrounds SRAM 10a. Similarly, the second device interconnect members 58 span a second seal ring 60b that surrounds the SRAM 10b.

Figure 5:
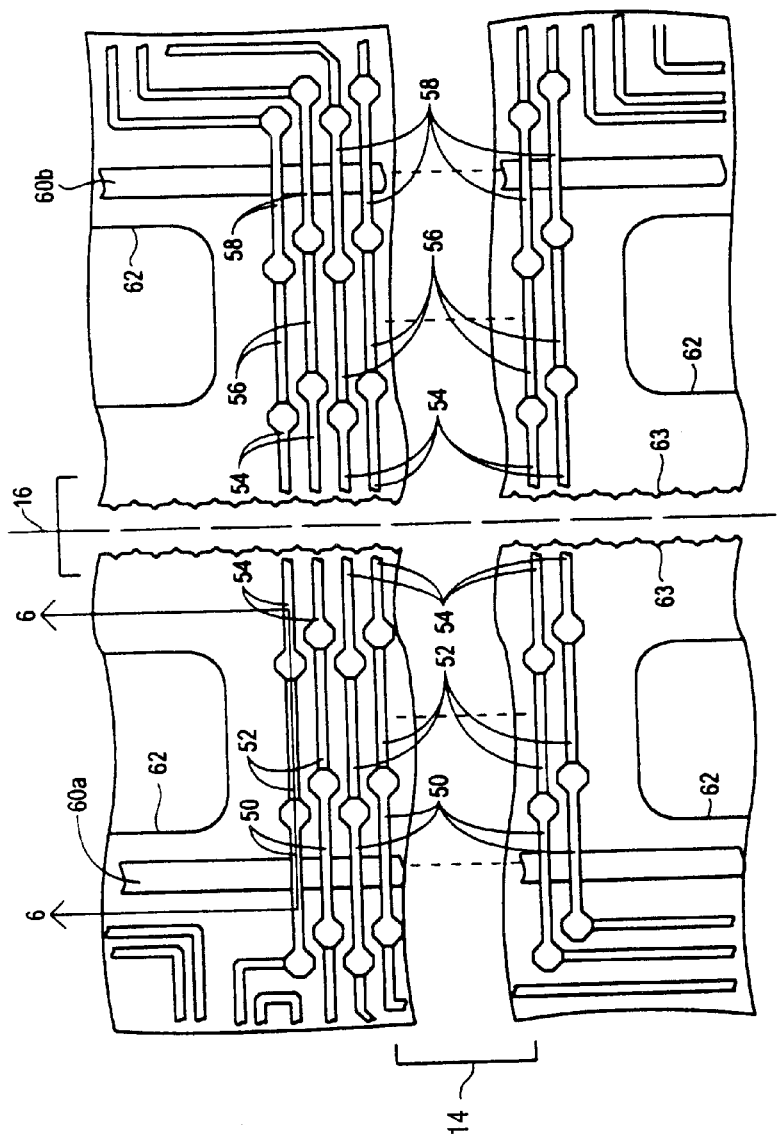
FIG. 5 is a top plan view illustrating the interconnect scheme of the preferred embodiment.

Referring now to FIG. 5, a top plan view is set forth illustrating the interconnect scheme 14 in detail. In the preferred embodiment, the seal rings (60a and 60b) extend in a first direction, parallel to one another. Adjacent to each seal ring (60a and 60b) is a die seal edge 62 that generally follows the seal rings (60a and 60b). Unlike conventional die seal arrangements, where the die seal surrounds each individual die, as set forth in the figure, the die seal edge 62 of the preferred embodiment spans the single device scribe line area 18, surrounding the interconnect scheme 14. The seal rings (60a and 60b) are fabricated from a first conductive layer and extend to the semiconductor substrate, as is well understood in the art. The first and second device interconnect members (50 and 58) are formed from a second conductive layer, formed subsequent to the first conductive layer, and extend over their respective seal rings (60a and 60b) to the first and second under/overpass structures (52 and 56), respectively. The first under/overpass structure 52 is formed from the first conductive layer and couples the first device interconnect members 50 to corresponding scribe line interconnect members 54. In the same fashion, the second under/overpass structure 56 is formed from the first conductive layer and couples the second device interconnect members 58 to corresponding scribe line interconnect members 54. The scribe line interconnect members 54 are formed from the second conductive layer. The depiction of FIG. 5 illustrates the resulting die edges 63 created by cutting along the single device scribe line 16 through the scribe line interconnect members 54.

Figure 6A:
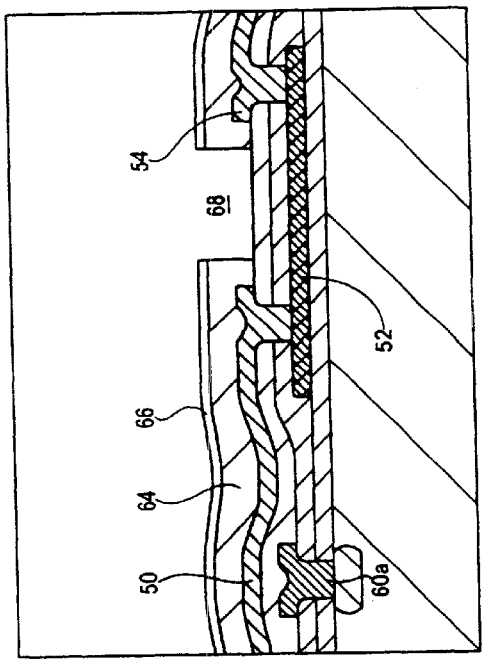
FIGS. 6a–6c are side cross sectional views of the interconnect scheme according to the preferred and alternate embodiments.
Figure 6B:
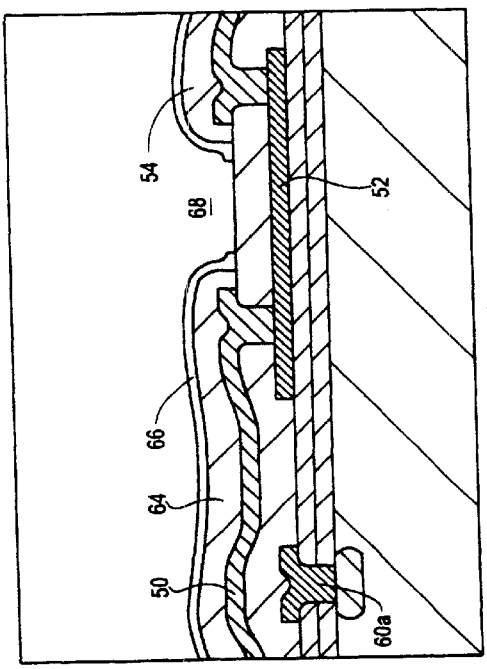
Figure 6C:
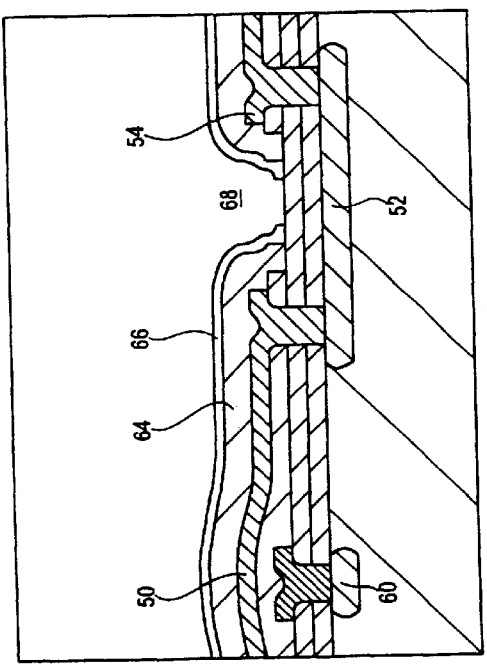

FIGS. 6a–6c are side cross-sectional view illustrating various embodiments of the first and second under/overpass structure (52 and 56). FIG. 6a is the preferred embodiment described in connection with FIG. 5. Notably, a first and second topside insulation layers (64 and 66) are formed over the first device interconnect member 54 and the scribe line interconnect member 54, but are not formed over a portion of the under/overpass structure (52 or 56), resulting in an under/overpass seal gap 68. If the scribe line interconnect members 50 should lift-off during, or after the cutting operation, the under/overpass seal gap 68 prevents the lifting effect from propagating to the SRAM (10a or 10b).

FIG. 6b illustrates an under/overpass structure wherein the first under/overpass structure 52 is formed from polysilicon and the under/overpass seal gap 68 is formed by anisotropic etching. Such an embodiment could include multiple, parallel polysilicon members for connecting one first interconnect member 50 to its associated scribe line interconnect member 54 in order to decrease the resistance of the connection. Further, the polysilicon under/overpass members could be fusible links that are vaporized in the event single mode devices 10 are desired. FIG. 6c illustrates an alternate embodiment in which the first under/overpass structure 52 is formed by conductive areas formed in the substrate. For example, an n+ diffusion layer could be used in the case of a p-type substrate.

One skilled in the art would recognize that while the preferred embodiment illustrates has an interconnect scheme 14 with conductive members generally concentrated in one area, the interconnect scheme could include interconnect structures spaced at various intervals spanning the single device scribe line area 18. Accordingly, the particular interconnect arrangement set forth herein should not be construed as limiting the invention thereto.

Figure 7:
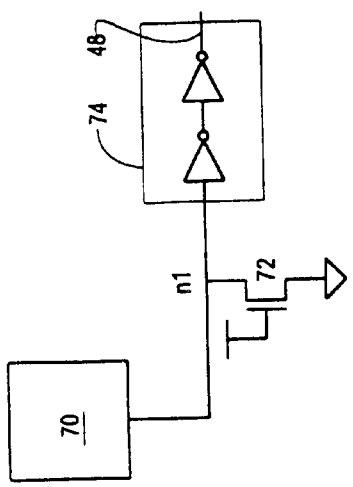
FIG. 7 is a schematic diagram illustrating the mode circuit of the preferred RAM embodiment.

Referring back to the embodiment of FIG. 4, it is shown that the mode signal carried by the mode input line 48 is generated by the mode circuit 30. The mode circuit is coupled to a mode bond pad 70. FIG. 7 illustrates a mode circuit 30 according to a preferred embodiment. The mode circuit 30 includes the mode bond pad 70, a leaker transistor 72, and a driver stage 74. The mode bond pad 70 and leaker transistor 72 are coupled to an input node N1. Absent the presence of a voltage at the mode bond pad 70 the leaker transistor places the mode circuit in a default mode (single device mode) and the mode input line 48 is low. If a high voltage is applied to the mode bond pad 70, leaker transistor 72 is over-powered and node N1 remains high, and the mode input line 48 is also driven high. Thus, in order to place the preferred embodiment in the multiple device mode, mode bond pad 70 is coupled to a high voltage (Vcc) when the device is bonded in the packaging process. While the preferred embodiment sets forth a bonding option for placing the devices 10 in the single of multiple device mode, it is understood that this should not be construed as limiting the invention thereto. Just a few of the possible alternate ways of placing a device in one of the modes include using fusible links to establish mode logic settings, having an automatic mode setting circuit that detects whether the interconnect scheme 14 is intact, or utilizing electrically programmable structures to program the devices into a particular mode.

Referring once again to FIG. 4, each SRAM (10a and 10b) is shown to include eight data I/O pads 76, each having a corresponding I/O circuit 78. As is well understood in the art, in a read operation, the I/O pads 76 are driven according the address received by the SRAM (10a or 10b).

Figure 8:
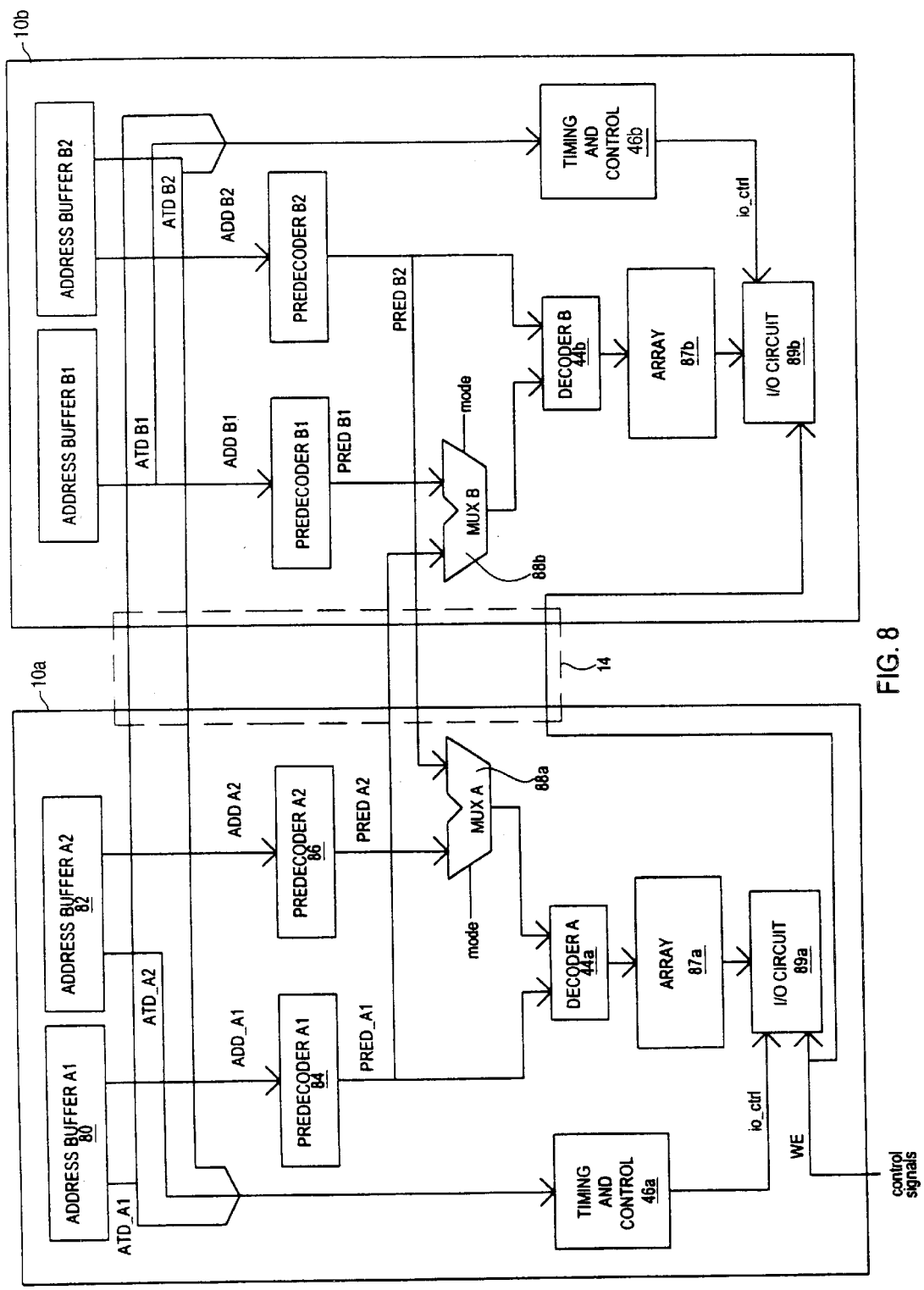
FIG. 8 is a block schematic diagram illustrating the operation of the preferred RAM embodiment of the present invention.

FIG. 8 is a block schematic diagram illustrating the operation of the preferred RAM embodiment. SRAM 10a and SRAM 10b each include address buffers that can be conceptualized as including a shared signal address buffer 80 (shown as address buffer A1 in SRAM 10a and address buffer B2 in SRAM 10b) and non-shared signal address buffer 82 (shown as address buffer A2 in SRAM 10a and address buffer B1 in SRAM 10b). Each address buffer (80 and 82) generates control signals (shown as "ATD x" where x corresponds to the address buffer identification) and buffered address signals (shown as "ADD x"). The buffered address signals from shared signal address buffers 80 are coupled to shared signal predecoders 84 (shown as PRED A1 and PRED B2 in FIG. 8). In a corresponding fashion, buffered address signals from the non-shared signal address buffers 82 are coupled to non-shared signal predecoders 86 (PRED A2 and PRED B1). According to well understood techniques, each predecoder (84 and 86) generates predecode signals (shown as "PRED x") in response to received buffered address signals. Like conventional SRAM configurations, within each SRAM (10a and 10b) predecode signals are coupled to a decoder circuits (44a and 44b) which select and columns and/or rows in SRAM array (87a and 87b). Unlike conventional SRAMs, predecode signals RED A1 are coupled from SRAM 10a by way of interconnect scheme 14 to SRAM 10b, and predecode signals PRED B2 are coupled from SRAM 10b to SRAM 10a. Further, predecode multiplexer circuits (88a and 88b), responsive to the mode signal, are situated between each non-shared signal predecoder and its corresponding decoder. As a result, when the mode signal is low, indicating single device mode, predecode multiplexer circuit 88a couples predecode signals PRED A2 to decoder 44a, and predecode multiplexer circuit 88b coupled predecode signals PRED B1 to decoder 44b. When the mode signal is high, indicating the multiple device mode, predecoder signals from the adjacent SRAM are coupled to the decoder (i.e., PRED A1 from SRAM 10a is coupled to decoder 88b in SRAM 10b, PRED B2 from SRAM 10b is coupled to decoder 88a in SRAM 10a).

Referring once again to FIG. 8, each SRAM (10a and 10b) includes an associated timing and control circuit (46a and 46b). The timing and control circuits (46a and 46b) receive the control signals (ATD x) from the address buffers located within their respective SRAM, as well as from the shared address signal buffer 80 of the adjacent SRAM. In this manner, timing and control circuit 46a receives the ATD A1, ATD A2 and ATD B2 timing signals, and timing and control circuit 46b receives the ATD B1, ATD B3 and ATD A1 control signals. The timing and control circuits (46a and 46b) provide timing and control signals (io_ctrl) to data I/O circuits (89a and 89b). The data I/O circuits also receive an externally applied write enable signal (WE). The WE signal is coupled between the SRAMs (10a and 10b) by the interconnect scheme 14. Additional externally applied control signals, such as chip enable and output enable, naturally follow from the above WE example, and are excluded to avoid unnecessarily complicating this description.

FIG. 9a illustrates the preferred SRAM embodiment manufactured in the single device mode. The wafer upon which the SRAMs are fabricated is sawed into individual dies each representing a stand-alone "by eight" SRAM. As a result, the interconnect scheme 14 is not intact, as the scribe line interconnect members 54 are severed by the sawing operation. SRAM 10a is placed in an integrated circuit package (not shown), and bonded out in a conventional manner: all the address pads 38 and data I/O pads 76 are bonded out to integrated circuit package leads (not shown). Notably, the mode bond pad 70 is not bonded, setting the SRAM 10a in the default (single device) operating mode.

Figure 9B:
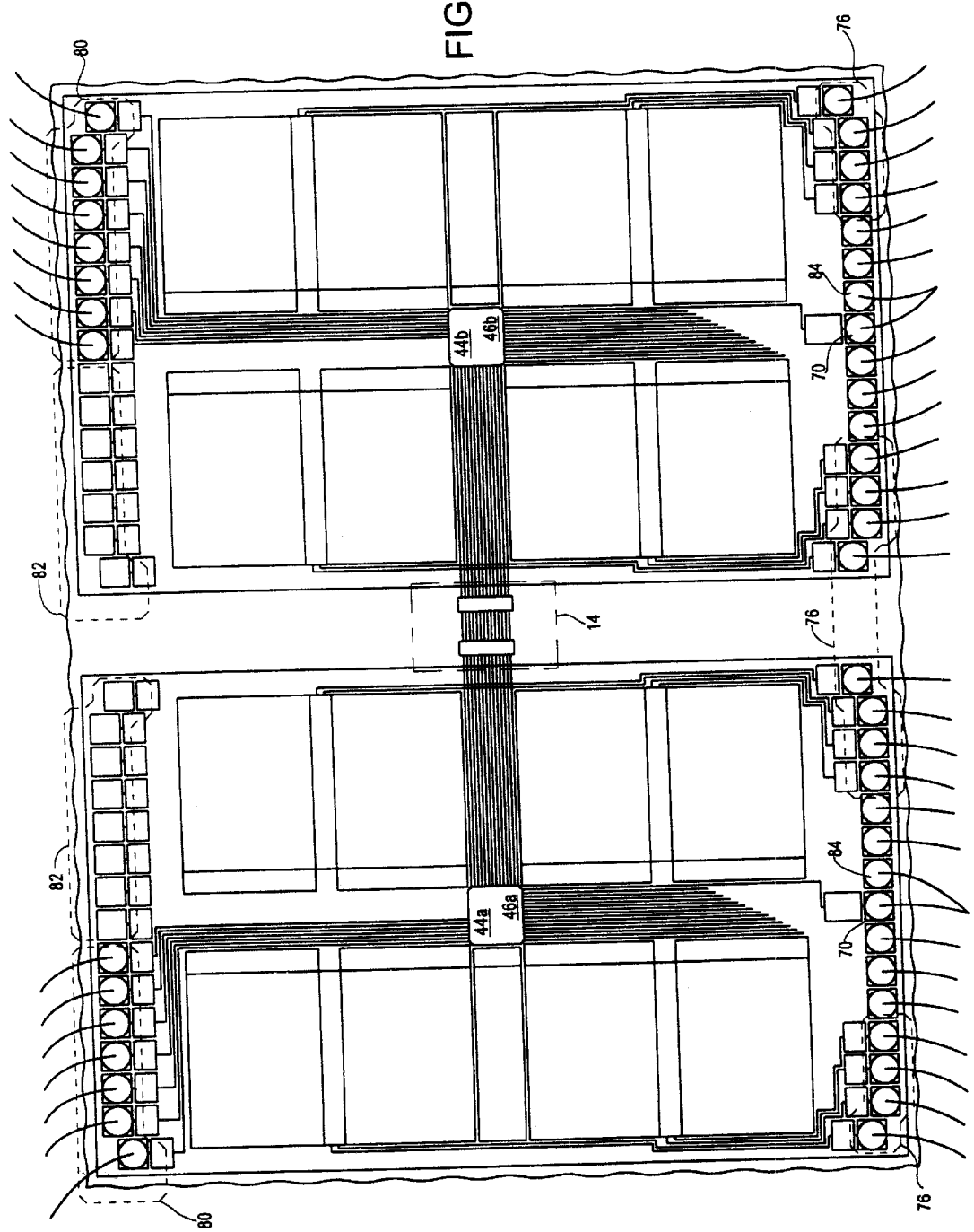

FIG. 9b illustrates the preferred SRAM embodiment manufactured in the double device mode. The wafer upon which the SRAMs (10a and 10b) are fabricated is sawed into dies that contain SRAM pairs (10a and 10b) joined by interconnect schemes 14. Unlike the conventional bonding arrangement of FIG. 9a, the address pads include bonded address pads 80, which are bonded out to an integrated circuit package (not shown), and non-bonded address pads 82. The address pads of SRAM 10b are bonded out in a complementary manner to those of SRAM 10a (i.e., the bonded address pads of SRAM 10a correspond to the non-bonded address pads 82 of SRAM 10b). It is noted that the mode bond pads 70 of the SRAMs (10a and 10b) are coupled to the same package pin as adjacent Vcc bond pads 84. With the mode bond pads 70 coupled to Vcc, the SRAMs (10a and 10b) are placed in the multiple device operating mode. FIG. 9b also sets forth the effective address signal paths of the double device option. Those internal address lines corresponding to the bonded address pad 80 of SRAM 10a carry a signal to the decoder circuit 44a and timing and control circuit 46a. The decoder circuit 44a and timing and control circuit 46a, in turn, provide corresponding internal address and control signals to the adjacent SRAM 10b over the interconnect scheme 14. Correspondingly, SRAM 10b provides complementary internal address signals to the SRAM 10a over the interconnect scheme 14. The end result is the same effective address is simultaneously applied to both SRAMs (10a and 10b). Each SRAM (10a and 10b) generates a ×8 output in response to each address. Because the data I/O pads 76 on both SRAMs (10a and 10b) are bonded out to package data I/O pins (not shown), the double device die produces a "by sixteen" data I/O.

Unlike prior art approaches, where device configuration options are determined by a custom metal mask(s), the present invention allows for decisions on device configuration to be reserved until the assembly stage.

Figure 10B:
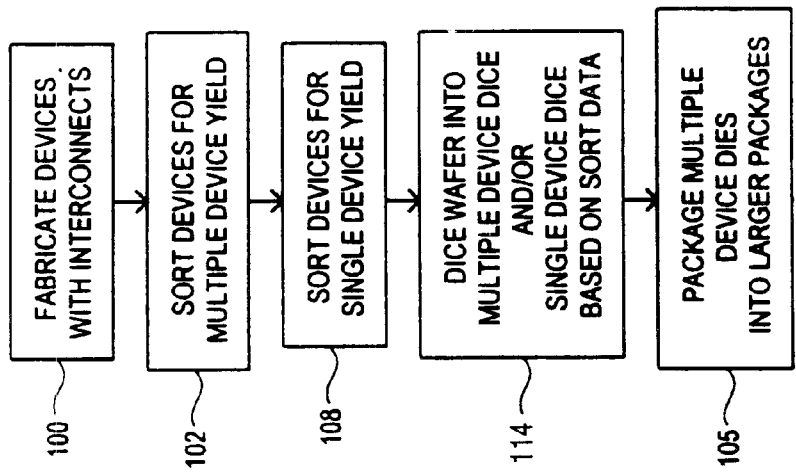
FIGS. 10a–10b are flowcharts depicting methods of fabricating integrated circuit devices according to the present invention.
Figure 10A:
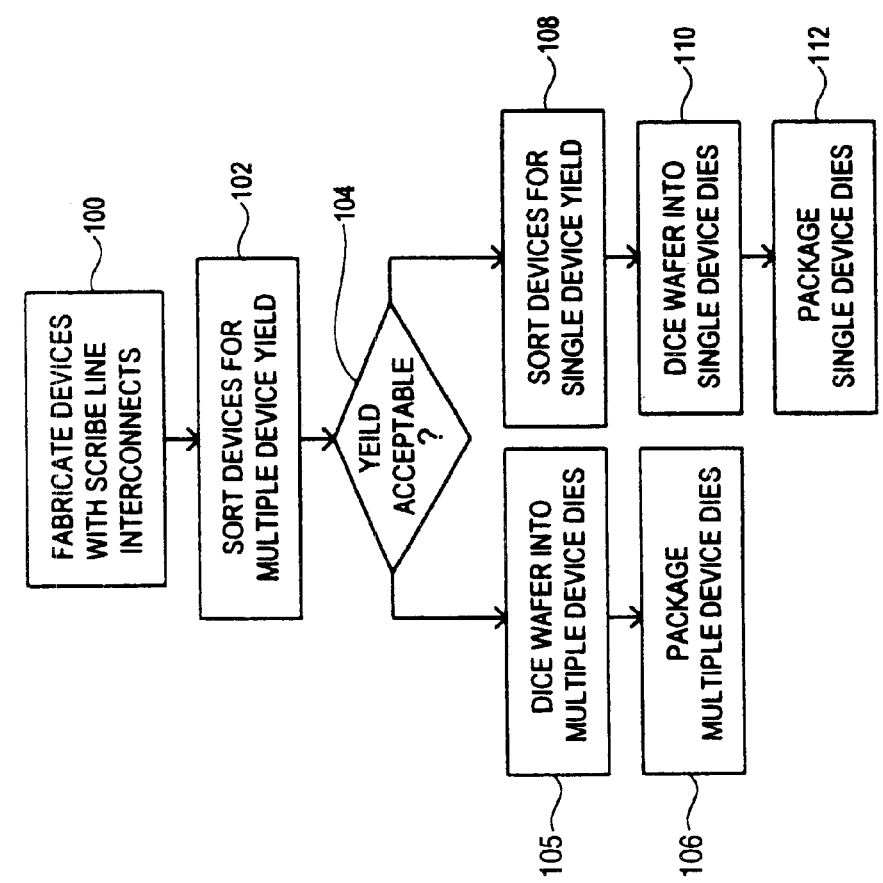

Referring now to FIGS. 10a and 10b, two assembly approaches for the preferred RAM embodiment are set forth in a flow chart format. In FIG. 10a, devices are fabricated with scribe line interconnects (step 100). The devices are then sorted for a "multiple" device yield (step 102). For the SRAM devices previously described, pairs of SRAMs are tested for functionality by applying test signals with a number of needle probes. Such test signals would include a needle coupled to the mode bond pads 70 to place the SRAM pairs in the multiple device mode. The resulting yield data is then used to determine the dicing procedure for the wafer (step 104). In the event the double device yield is acceptable, the wafer is sawed in to multiple device dies (step 105) and packaged accordingly (step 106). In the event the double device yield is not acceptable, the wafer is sorted for single device yield (step 108), sawed into single device dies (step 110) and then packaged (step 112).

FIG. 10b sets forth a procedure similar to that of FIG. 10a, but more appropriate for the case where more complex sorting and wafer cutting equipment is available. Like the case of FIG. 10a, the approach of FIG. 10b begins with the fabrication of the devices (step 100). The wafer sort steps of FIG. 10b differ from those of FIG. 10a. The wafer is sorted for multiple device yield (step 102), and in the event a multiple device is defective, the single devices making up the multiple devices are then sorted for a single device yield (step 108). This data is then used to saw the wafer for optimum yield to produce both single device dies and multiple device dies (step 114). The dies are then packaged accordingly (steps 105 and 112).

Figure 11B:
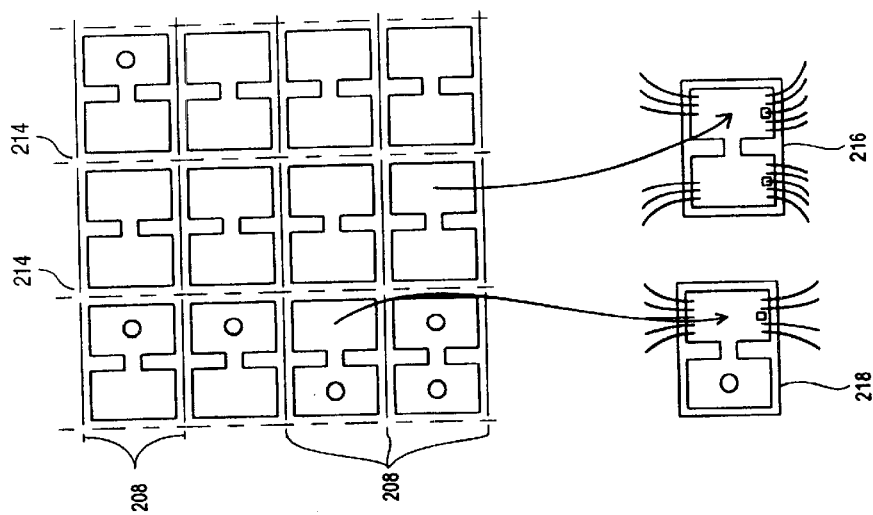
FIGS. 11a–11b illustrate two wafer dicing options according to the preferred RAM embodiment.
Figure 11A:
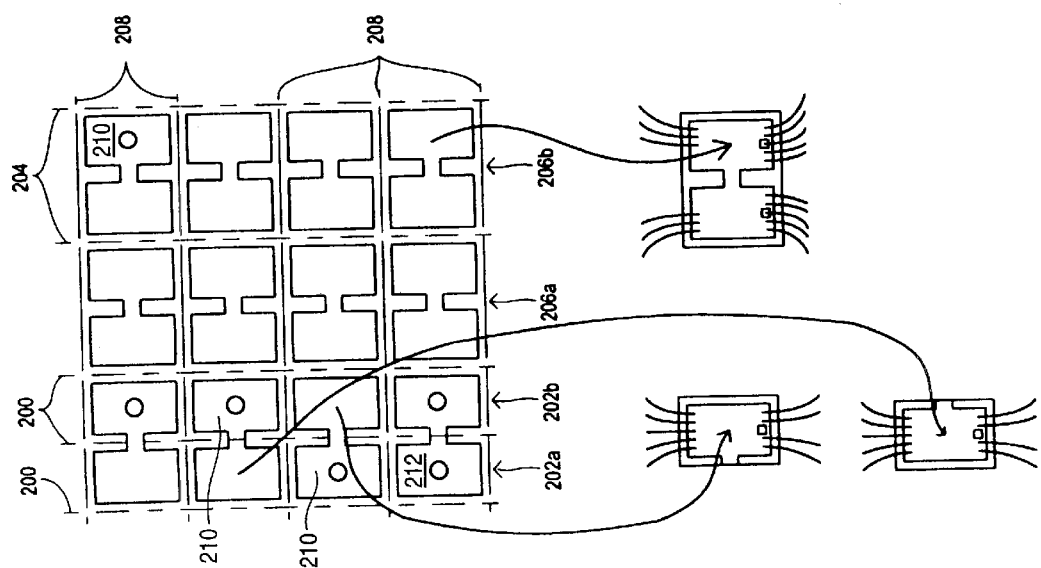

FIG. 11a illustrates the manufacture of devices according to the method of FIG. 10b. The devices have been sorted, and so, defective single devices have been "inked" by placing a black ink dot in the middle of the device. Vertical sawing is performed based upon the die sort yield. The first three vertical cuts 200 are performed by stepping across the wafer at one device intervals to create two vertical strips of single device dies (202a and 202b). The fourth and fifth vertical cuts 204 are performed at two device intervals resulting in two vertical strips of double device dies (206a and 206b). Horizontal cuts 208 are performed at single device intervals. The single device strips (202a and 202b) and double device strips are then sorted, and packaged accordingly (including being bonded out appropriate mode of operation). Inked single device dies 210 and inked double device dies 212 are scrapped.

FIG. 11b illustrates the manufacture of devices in the case where the die size of single devices is sufficiently small to fit multiple device dies into single device packages. Vertical sawing is performed by stepping across the waver after each vertical cut 214 by two device intervals. Horizontal cuts 208 are performed at single device intervals. The devices are then packaged and bonded out according to whether they contain a viable double device 216 or only one viable single device 218 within a double device pair.

It is understood that the embodiments set forth herein are only some of the possible embodiments of the present invention, and that the invention may be changed, and other embodiments derived, without departing from the spirit and scope of the invention. Accordingly, the invention is intended to be limited only by the appended claims.

I claim:

1. A method of fabricating semiconductor devices, the method comprising:

(a) fabricating a plurality of first integrated circuits and adjacent second integrated circuits on a semiconductor wafer, each first integrated circuit being coupled to at least one second integrated circuit by an interconnect scheme, the first and second integrated circuits being separated from one another by single device scribe lines, interconnected first and second integrated circuits being separated by multiple device scribe lines, the interconnect scheme spanning the single device scribe lines;

(b) forming multiple integrated circuit devices by dicing the wafer along multiple device scribe lines, thereby maintaining the interconnect scheme in tact and physically separating the wafer into multiple device dies that each include at least a first integrated circuit and its interconnected second integrated circuit; and (c) placing the first and second integrated circuits in a multiple device mode wherein signals originating in the first integrated circuit are carried by the interconnect scheme for use by the second integrated circuit.

2. The method of claim 1, and wherein:

step (b) includes dicing a first portion of the wafer along single device scribe lines to form single integrated circuit devices, and dicing a second portion of the wafer along multiple device scribe lines to form the multiple integrated circuit devices.

3. The method of claim 1, and wherein:

step (a) includes forming multiple device scribe lines that are a subset of the single device scribe lines.

4. The method of claim 1, and including:

before step (b), sorting the wafer to determine a multiple integrated circuit device yield and a single integrated circuit device yield.

5. The method of claim 1, and further comprising:

packaging each multiple integrated circuit device and placing the device in the multiple device mode by bonding out a mode bond pad.

* * * * *